United States Patent
Jung et al.

(10) Patent No.: US 7,855,505 B2
(45) Date of Patent: Dec. 21, 2010

(54) DISPLAY DEVICE SUPPLYING A COMMON VOLTAGE

(75) Inventors: Kwang-chul Jung, Seongnam-si (KR); Beohm-rock Choi, Seoul (KR); Joon-chul Goh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 761 days.

(21) Appl. No.: 11/769,884

(22) Filed: Jun. 28, 2007

(65) Prior Publication Data

US 2008/0036387 A1 Feb. 14, 2008

(30) Foreign Application Priority Data

Aug. 10, 2006 (KR) .................. 10-2006-0075844

(51) Int. Cl.
*H01J 1/62* (2006.01)
(52) U.S. Cl. .................. 313/505; 445/22; 313/498
(58) Field of Classification Search ......... 313/498–512; 315/169.1, 169.3; 445/23–25
See application file for complete search history.

(56) References Cited

FOREIGN PATENT DOCUMENTS

| CN | 1393838 A | 1/2003 |
|---|---|---|
| CN | 1400494 A | 3/2003 |
| JP | 2002287663 | 10/2002 |
| KR | 1020050034427 | 4/2005 |
| KR | 1020050090586 A | 9/2005 |
| KR | 1020060001378 | 1/2006 |

*Primary Examiner*—Joseph L Williams
(74) *Attorney, Agent, or Firm*—Cantor Colburn LLP

(57) ABSTRACT

A display device includes an insulating substrate having a display area, a line part including a data line and a gate line insulated from and crossing each other, a common voltage supplying part formed outside an outer circumference of the display area, an insulating layer formed on the common voltage supplying part and including a contact hole formed on an area in which some lines of the line part extend substantially in parallel with each other, and a common electrode electrically connected with the common voltage supplying part exposed through the contact hole.

22 Claims, 12 Drawing Sheets

DISPLAY DEVICE SUPPLYING A COMMON VOLTAGE

This application claims priority to Korean Patent Application No. 2006-0075844, filed on Aug. 10, 2006, and all the benefits accruing therefrom under 35 U.S.C. 119, the contents of which in its entirety are herein incorporated by reference.

BACKGROUND OF INVENTION

1. Field of the Invention

The present invention relates to a display device and a manufacturing method thereof. More particularly, the present invention relates to a display device supplying a common voltage thereto, and a manufacturing method of the display device.

2. Description of the Related Art

Recently, as one type of flat panel display, an organic light emitting diode ("OLED") has become popular since OLEDs have the advantages of requiring a low driving voltage, being relatively light weight and slim, having a wide viewing angle, having a high pixel response speed, and other positive attributes.

The OLED display includes an organic light emitting layer formed on an insulating substrate. The organic light emitting layer receives an electron from a common electrode and a hole from a pixel electrode to generate light. The common electrode is formed over an entire display area after the organic light emitting layer is formed. The common electrode is formed under restricted conditions since the organic light emitting layer is liable to be damaged by heat. In a top emission type display, the common electrode should be transparent. Accordingly, it is difficult to form the common electrode having a small resistance.

The common voltage should be supplied in various directions in order to efficiently supply a common voltage to the common electrode having a relatively large resistance. Accordingly, a configuration for supplying the common voltage becomes complicated, and the size of an insulating substrate increases to supply the common voltage.

BRIEF SUMMARY OF THE INVENTION

Accordingly, it is an aspect of the present invention to provide a display device supplying a common voltage with a relatively small sized insulating substrate.

Also, it is an aspect of the present invention to provide a manufacturing method of a display device supplying a common voltage with a relatively small sized insulating substrate.

The foregoing and/or other aspects, features and advantages of the present invention can be achieved by providing an exemplary embodiment of a display device including an insulating substrate including a display area, a line part including a data line and a gate line, the data line crossing the gate line, the data line and the gate line insulated from each other, a common voltage supplying part formed outside an outer circumference of the display area, an insulating layer formed on the common voltage supplying part, and comprising a contact hole formed on an area in which some lines of the line part extend substantially in parallel with each other, and a common electrode electrically connected with the common voltage supplying part exposed through the contact hole.

The display device may further include a circuit substrate connected to a first side of the insulating substrate substantially in parallel with an extending direction of the gate line, and the circuit substrate may provide a common voltage to the common voltage supplying part, wherein the common voltage supplying part includes a first sub common voltage supplying part positioned between the display area and the circuit substrate, and the common voltage supplying part may extend substantially in parallel with the gate line.

The first sub common voltage supplying part and the data line may be formed in different layers of the display device.

The data line may include a main body part having a plurality of parallel lines, and a fan out part having a plurality of lines extending from the main body part toward the circuit substrate, and the first sub common voltage supplying part may extend substantially perpendicular to and cross the main body part of the data line.

The display device may further include a gate driving part positioned on a second side of the insulating substrate substantially in parallel with an extending direction of the data line, and the gate driving part may be connected with the gate line, wherein the common voltage supplying part may include a second sub common voltage supplying part positioned between the gate driving part and the display area, and may extend substantially in parallel with the data line.

The second sub common voltage supplying part and the gate line may be formed in different layers of the display device.

The gate line may include a main body part having a plurality of parallel lines, and a fan out part having lines extending from the main body part toward the gate driving part, and the second sub common voltage supplying part may extend substantially perpendicular to and cross the main body part of the gate line.

The display device may further include a power supply line substantially parallel with the data line, and a driving voltage supplying part positioned between the display area and the circuit substrate, and the driving voltage supplying part may extend substantially in parallel with the gate line to supply a driving voltage to the power supply line.

The insulating substrate may include a rectangular shape, and the common voltage supplying part may be disposed on four sides of the insulating substrate.

The display device may further include a power supply line substantially in parallel with the data line, a driving voltage supplying part elongated adjacent to a third side of the insulating substrate facing the first side, and connected with the power supply line, and a driving voltage transmitting part may connect the driving voltage supplying part and the circuit substrate.

A pair of driving voltage transmitting parts may face each other to interpose the display area there between.

The display device may further include a contact member contacting the common voltage supplying part exposed through the contact hole, and the contact member may be formed of a transparent conductive material.

The foregoing and/or other aspects, features and advantages of the present invention can also be achieved by providing an exemplary embodiment of a display device, including a line part including a main body part having lines substantially paralleling each other, and a fan out part extending from the main body part, a common voltage supplying part crossing the main body part and insulated from the main body part which is insulated, an insulating layer formed on the common voltage supplying part, and including a contact hole exposing the common voltage supplying part, and a common electrode electrically connected with the common voltage supplying part exposed through the contact hole.

The main body part and the common voltage supplying part may extend substantially perpendicular to and cross each other. Also, the main body part and the common voltage supplying part may be formed in different layers of the display device.

The line part may include at least one of a gate line, a data line, and a power supply line.

The contact hole may be provided in plurality between adjacent lines of the main body part.

The foregoing and/or other aspects, features and advantages of the present invention can also be achieved by providing a manufacturing method of a display device, the method including forming a line part including a main body part having lines substantially paralleling each other, and a fan out part extending from the main body part, forming a common voltage supplying part crossing the main body part and insulated from the main body part, forming an insulating layer on the common voltage supplying part and including a contact hole exposing the common voltage supplying part under the insulating layer, and forming a common electrode electrically connected with the common voltage supplying part exposed through the contact hole.

BRIEF DESCRIPTION OF THE DRAWINGS

The above and other aspects, features and advantages of the present invention will become more apparent by describing in more detail exemplary embodiments thereof with reference to the accompanying drawings, in which.

DETAILED DESCRIPTION OF THE INVENTION

Figure 1:
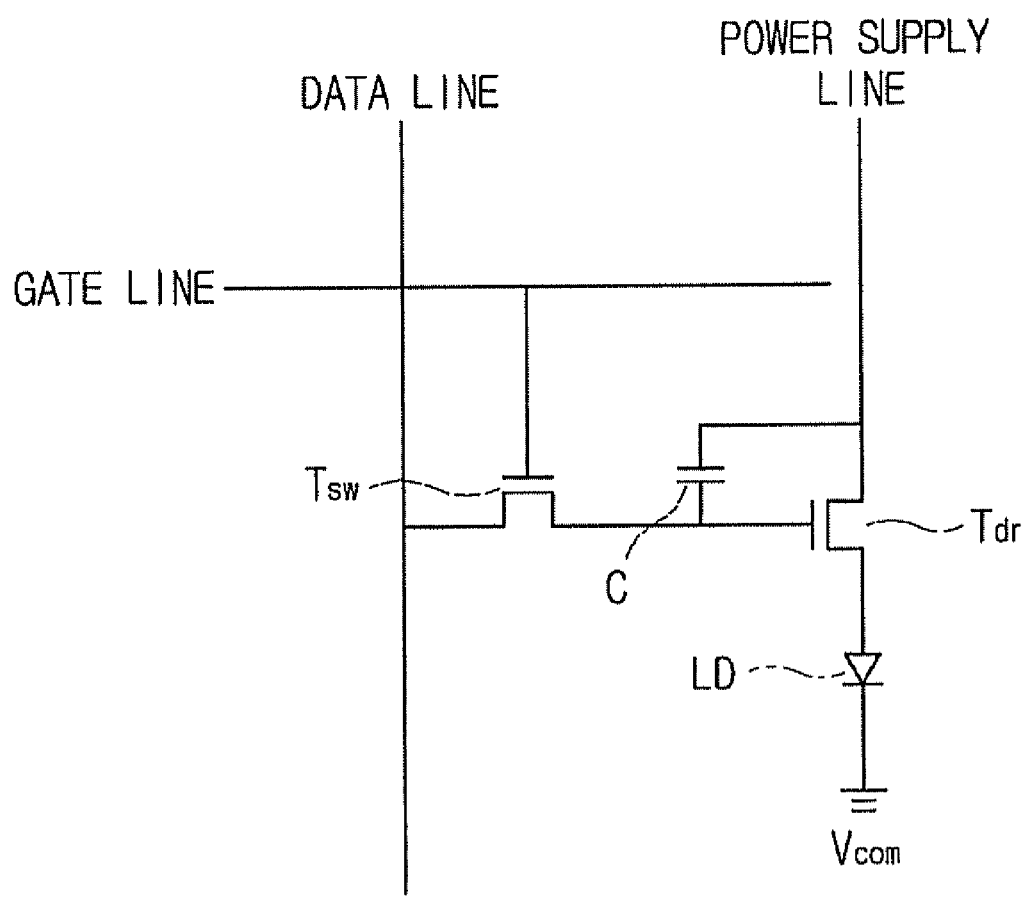
FIG. 1 is an equivalent circuit diagram of an exemplary pixel provided to a first exemplary embodiment of a display device according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

FIG. 1 is an equivalent circuit diagram illustrating an exemplary pixel of a first exemplary embodiment of a display device according to the present invention.

A single pixel is provided with a plurality of signal lines. The signal lines include a gate line transmitting a scanning signal, a data line transmitting a data signal, and a power supply line transmitting a driving voltage. The data lines are arranged adjacently and substantially in parallel to the power supply lines, and the gate lines extend substantially perpendicular to and cross the data lines and the power supply lines.

Referring to FIG. 1, each pixel includes an organic light emitting element LD, a switching thin film transistor ("TFT") Tsw, a driving TFT Tdr and a capacitor C.

The driving TFT Tdr includes a control terminal, an input terminal, and an output terminal. The control terminal is connected to the switching TFT Tsw and one side of the capacitor C, the input terminal is connected to the power supply line and another side of the capacitor C, and the output terminal is connected to the organic light emitting element LD.

The organic light emitting element LD includes an anode connected to the output terminal of the driving TFT Tdr, and a cathode connected to a common voltage Vcom. The organic light emitting element LD emits light with varying intensity depending on an output current of the driving TFT Tdr to display an image. The amount of current from the driving TFT Tdr varies according to the voltage supplied between the control terminal and the output terminal thereof. A plurality of organic light emitting elements LD may work together to display an image.

Still referring to FIG. 1, the switching TFT Tsw also includes a control terminal, an input terminal, and an output terminal. The control terminal is connected to the gate line, the input terminal is connected to the data line, and the output terminal is connected to the control terminal of the driving TFT Tdr and one side of the capacitor C. The switching TFT Tsw transmits the data signal supplied from the data line to the driving TFT Tdr based on the scanning signal supplied from the gate line.

The capacitor C is connected between the control terminal and the input terminal of the driving TFT Tdr. The capacitor C is charged with the data signal inputted to the control terminal of the driving TFT Tdr, and the capacitor C maintains the data signal.

Figure 2:
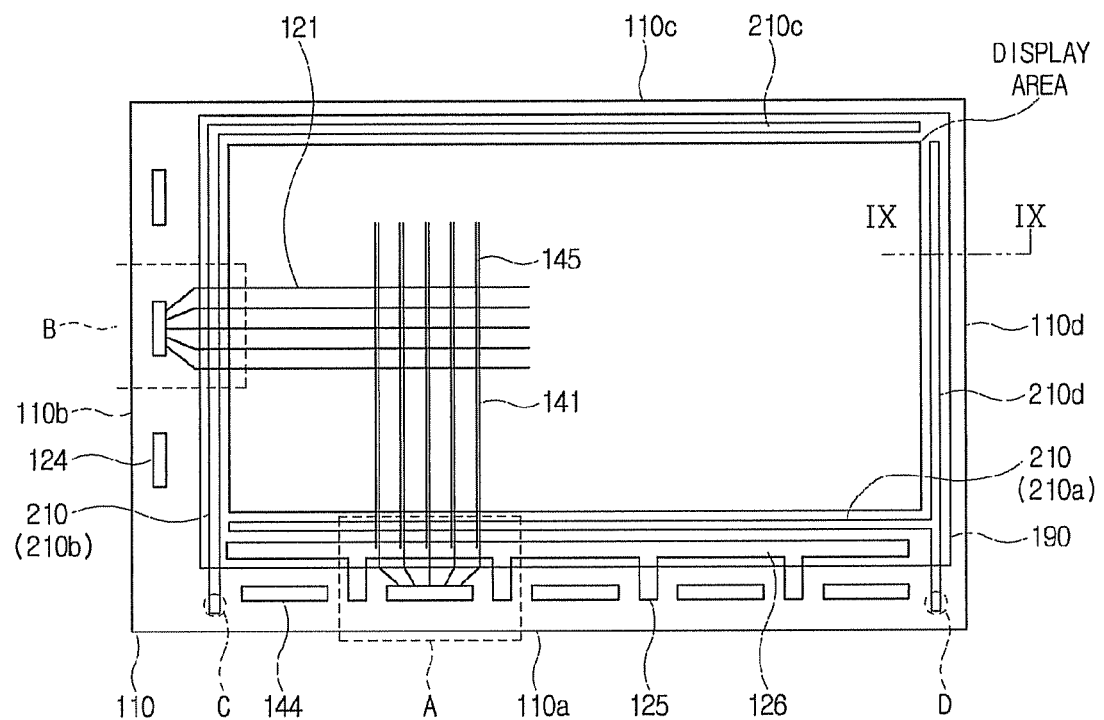
FIGS. 2 and 3 are schematic top plan layout views of a first exemplary embodiment of a display device according to the present invention.
Figure 3:
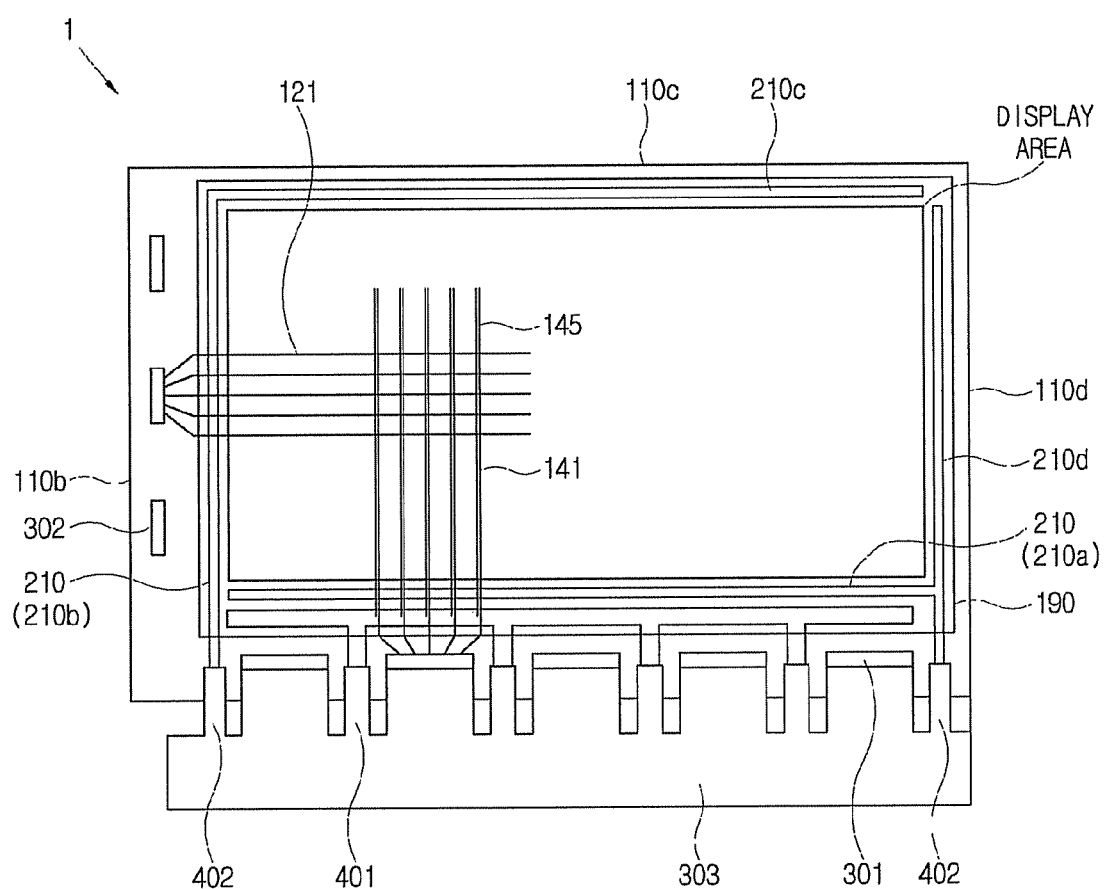

FIGS. 2 and 3 are schematic top plan layout views of a first exemplary embodiment of the display device according to the present invention. FIG. 2 illustrates a state in which a circuit substrate 303, a driving part (a driving chip) and a power transmitting film are omitted, but shown in FIG. 3.

As shown in FIG. 2, an insulating substrate 110 includes a display area having a rectangular shape, and a non-display area surrounding the display area. A common voltage supplying part 210 is formed around a circumference of the display area, and a common electrode 190 receives the common voltage from the common voltage supplying part 210. The insulating substrate 110 has a substantially rectangular shape, and includes first through fourth sides 110a, 110b, 110c and 110d.

The non-display area will be described first.

A data pad 144 connected with a data driving part 301 is provided in the non-display area below the display area, that is, the non-display area adjacent to a first side 110a of the insulating substrate 110. The data pad 144 is connected with a data line 141 extending toward the display area.

The data pad 144 is provided as a plurality of uniformly distanced groups, and power supply pads 125 are positioned at every location between the groups of the data pads 144, as illustrated in FIG. 2. The power supply pad 125 receives the driving voltage through a driving voltage transmitting film 401, as illustrated in FIG. 3.

Referring to FIG. 2, each power supply pad 125 is connected to a driving voltage supplying part 126 disposed substantially in parallel with a gate line 121. A power supply line 145 extending substantially in parallel with the data line 141 is connected to the driving voltage supplying part 126.

A first sub common voltage supplying part 210a is disposed substantially in parallel with the gate line 121, in between the driving voltage supplying part 126 and the display area, as illustrated in FIG. 2.

Figure 4:
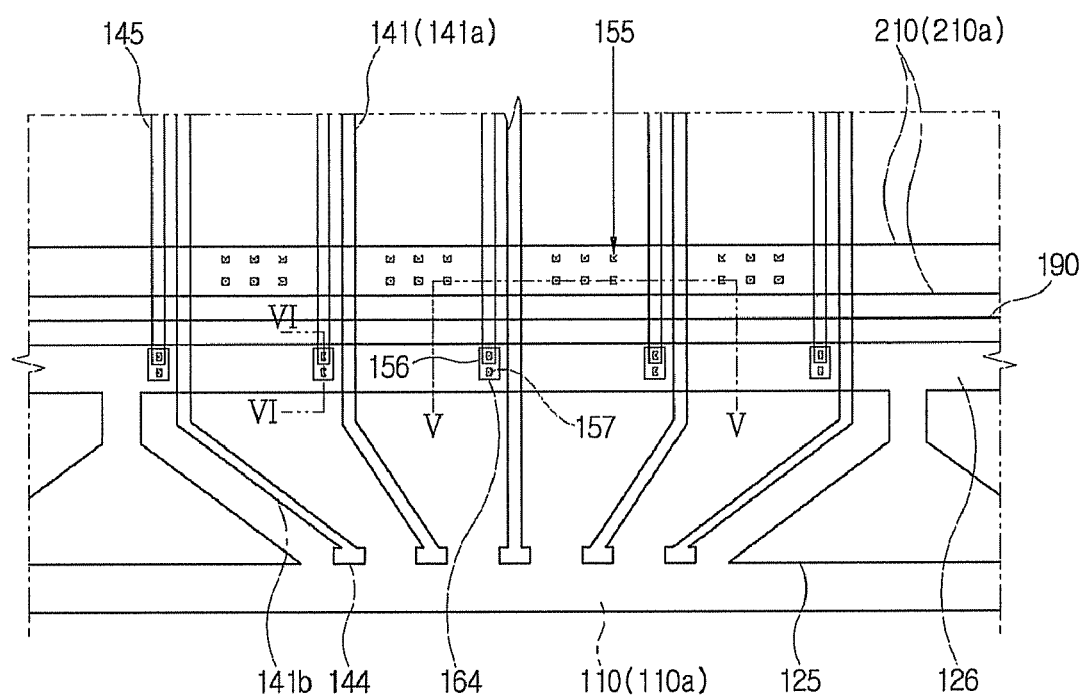
FIG. 4 is an enlarged schematic top plan view illustrating portion 'A' in FIG. 2.

Hereinafter, the driving voltage supplying part 126 and the first sub common voltage supplying part 210a will now be described in more detail with reference to FIGS. 4 to 6.

The driving voltage supplying part 126, the first sub common voltage supplying part 210a and the gate line 121 are formed in the same layer as each other, but different from the layer corresponding to the data line 141 and the power supply line 145.

The data line 141 includes a main body part 141a which is substantially in parallel with the data lines 141, and a fan out part 141b, which is not in parallel with the data lines 141, extending toward the data pad 144. The driving voltage supplying part 126 and the first sub common voltage supplying part 210a extend substantially perpendicular to the main body part 141a. In an alternative exemplary embodiment, a part of the first sub common voltage supplying part 210a may extend toward a lower portion of the fan out part 141b.

Figure 5:
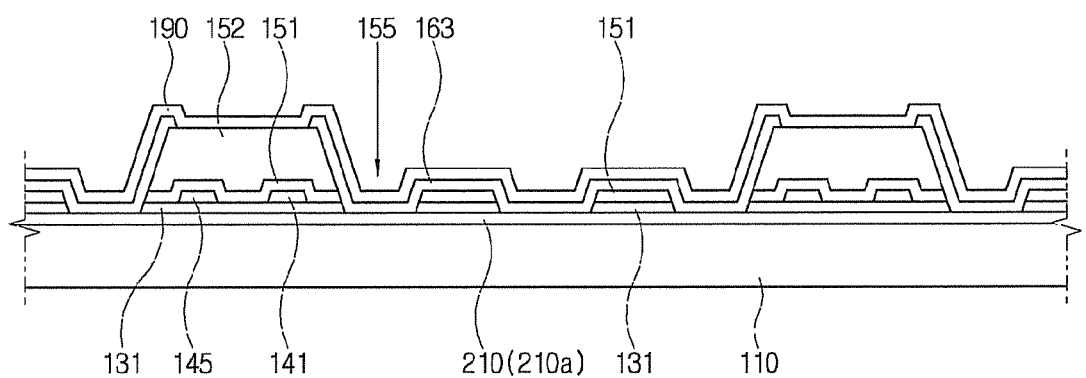
FIG. 5 is an enlarged schematic cross-sectional view taken along line V-V in FIG. 4.

Referring to FIG. 5, a portion of a gate insulating layer 131 and a passivation layer 151 are removed over the first sub common voltage supplying part 210a to form a contact hole 155. The first sub common voltage supplying part 210a exposed through the contact hole 155 is covered with a contact member 163 formed of a transparent conductive material. The common electrode 190 is connected with the contact member 163 to receive the common voltage from the first sub common voltage supplying part 210a.

Figure 6:
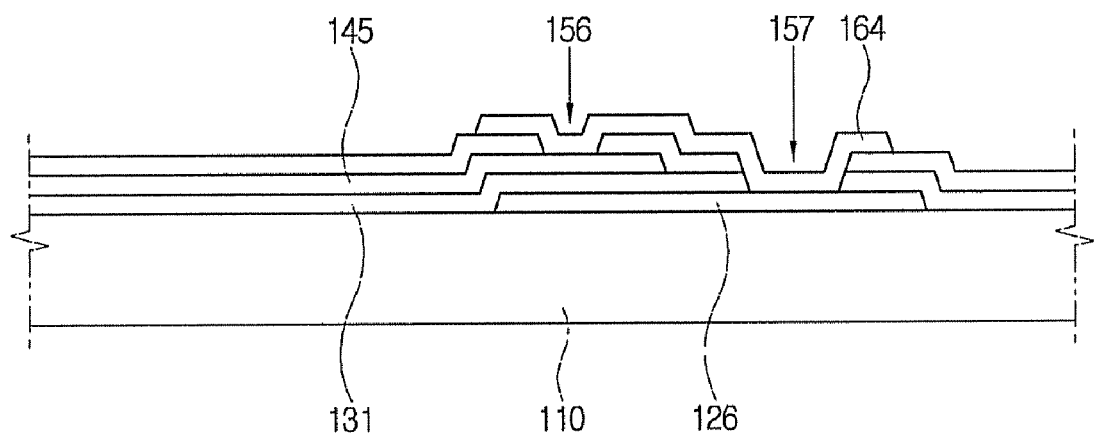
FIG. 6 is an enlarged schematic cross-sectional view taken along line VI-VI in FIG. 4.

Referring to FIG. 6, the driving voltage supplying part 126 and the power supply line 145 are formed in different layers, and the driving voltage supplying part 126 is connected to the power supply line 145 through a bridge part 164 formed of a transparent conductive material. The power supply line 145 and the driving voltage supplying part 126 are respectively formed such that contact holes 156 and 157 expose portions of the power supply line 145 and the driving voltage supplying part 126, respectively, and the power supply line 145 and the driving voltage supplying part 126 are connected to each other through the bridge part 164 via the holes 156, 157.

Figure 7:
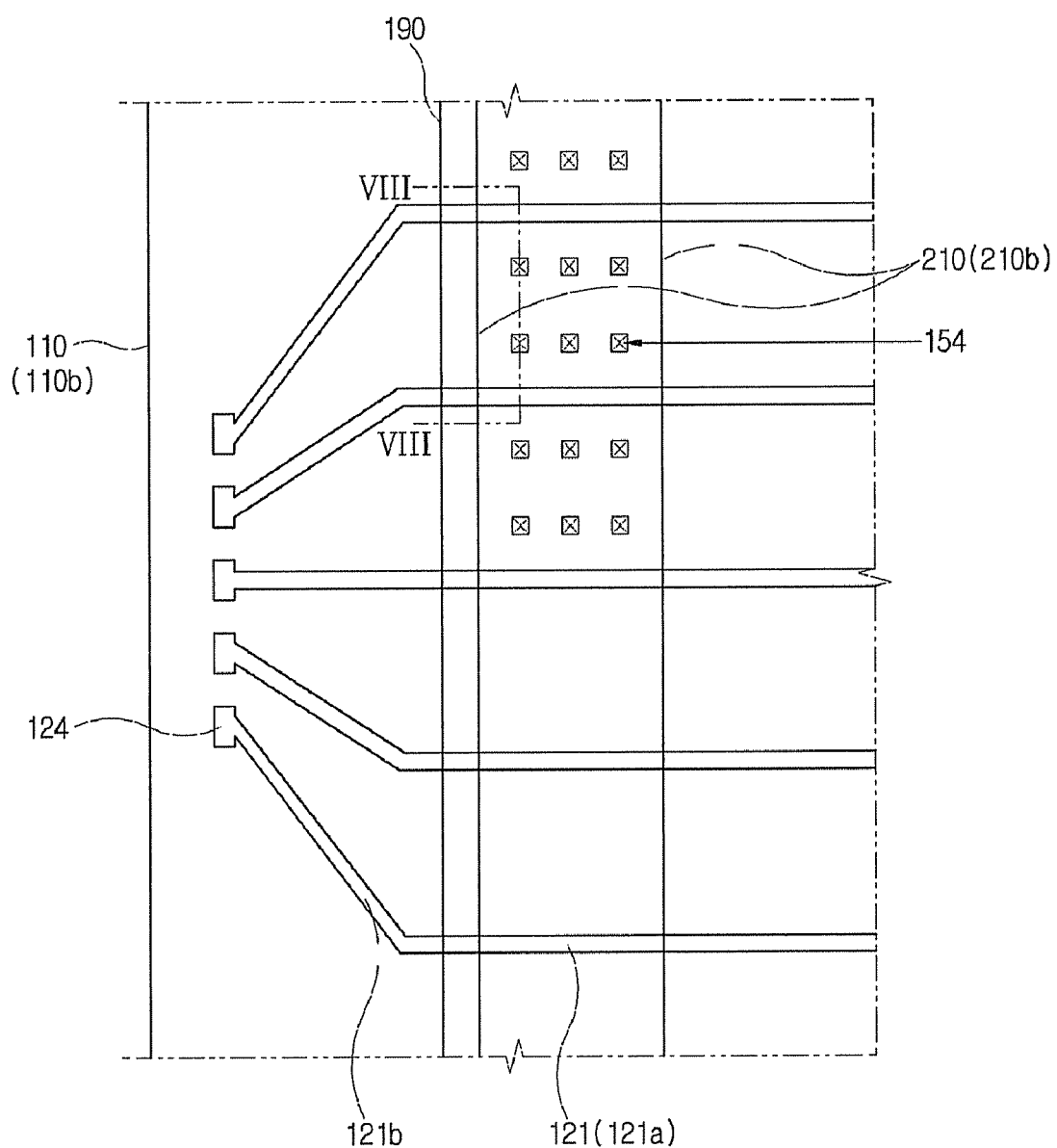
FIG. 7 is an enlarged schematic top plan view illustrating portion 'B' in FIG. 2.

Referring to FIG. 7, a gate pad 124 connected with a gate driving part 302 (FIG. 3) is provided in the non-display area on the left side of the display area, that is, the non-display area adjacent to a second side 110b of the insulating substrate 110. The gate pad 124 is connected with the gate line 121 extending toward the display area.

Referring to FIG. 3, the gate driving part 302 receives the driving signal from a circuit substrate 303 through a connecting line (not shown) formed on the insulating substrate 110.

Referring to FIG. 3, the driving parts 301 and 302 are provided as chips mounted on the data pad 144 and the gate pad 124 by a chip on glass ("COG") type process. In alternative exemplary embodiments, the driving parts 301 and 302 may be mounted on films, and the films may be connected to the gate pads 124 and the data pads 144.

A second sub common voltage supplying part 210b is disposed substantially in parallel with the data line 141 and in between the gate pad 124 and the display area, as illustrated in FIG. 2.

Hereinafter, the second sub common voltage supplying part 210b will now be described in more detail with reference to FIGS. 7 and 8.

The second sub common voltage supplying part 210b is formed in a layer different from a layer corresponding to the gate line 121 and the first sub common voltage supplying part 210a. The second sub common voltage supplying part 210b is formed in the same layer as the data line 141. An end portion C of the second sub common voltage supplying part 210b, illustrated in FIG. 2, is connected with a common voltage transmitting film 402 to receive the common voltage from the circuit substrate 303, as illustrated in FIG. 3.

Referring to FIG. 7, the gate line 121 includes a main body part 121a which includes the parallel gate lines 121, and a fan out part 121b which includes the portion of the gate lines 121 extending toward the gate pad 124 which are not in parallel with each other. The second sub common voltage supplying part 210b extends substantially perpendicular to the main body part 121a. In alternative exemplary embodiments, a part of the second sub common voltage supplying part 210b may extend to a lower part, or a part further from an edge of the display area, of fan out part 121b.

Figure 8:
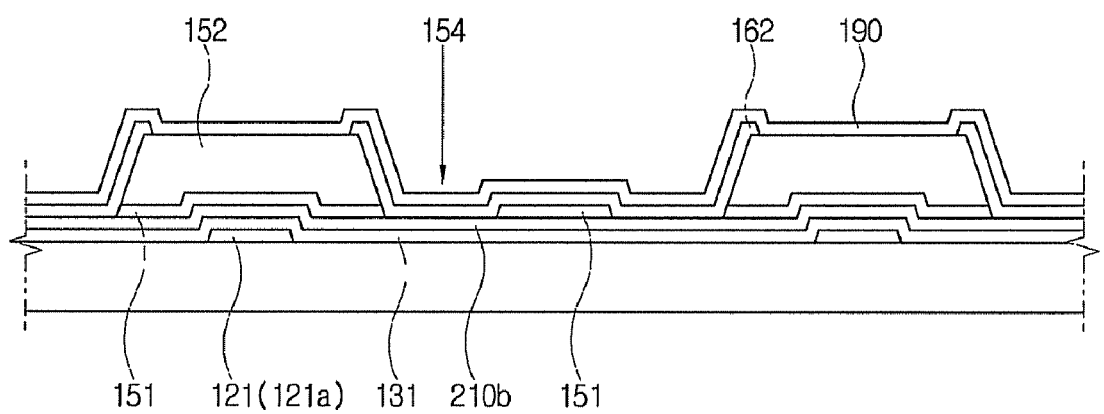
FIG. 8 is an enlarged schematic cross-sectional view taken along line VIII-VIII in FIG. 7.

Referring to FIG. 8, a portion of the passivation layer 151 is removed over the second sub common voltage supplying part 210b, to form a contact hole 154. The second sub common voltage supplying part 210b exposed through the contact hole 154 is covered with a contact member 162 formed of a transparent conductive material. The common electrode 190 is connected with the contact member 162 to receive the common voltage from the second sub common voltage supplying part 210b.

A third sub common voltage supplying part 210c extends substantially in parallel with the gate line 121 in the non-display area above the display area, that is, the non-display area adjacent to a third side 110c of the insulating substrate 110, as illustrated in FIG. 2.

The third sub common voltage supplying part 210c is formed integrally with the second sub common voltage supplying part 210b. The third sub common voltage supplying part 210c is formed with a contact hole (not shown) and a contact member (not shown), and the common electrode 190 is connected with the contact member to receive the common voltage from the third sub common voltage supplying part 210c, as illustrated in FIG. 2.

Still referring to FIG. 2, a fourth sub common voltage supplying part 210d extends substantially in parallel with the data line 141 in the non-display area on the right side of the display area, that is, the non-display area adjacent to a fourth side 110d of the insulating substrate 110. The fourth sub common voltage supplying part 210d is formed integrally with the first sub common voltage supplying part 210a. An end part D of the fourth sub common voltage supplying part 210d (FIG. 2) is connected with the common voltage transmitting film 402 to receive the common voltage from the circuit substrate 303, as illustrated in FIG. 3.

The fourth sub common voltage supplying part 210d will now be described in more detail with reference to FIG. 9.

A portion of the passivation layer 151 is removed from the fourth sub common voltage supplying part 210d to form a contact hole 158. The fourth sub common voltage supplying part 210d exposed through the contact hole 158 is covered by a contact member 165 formed of a transparent conductive material. The common electrode 190 is connected with the contact member 165 to receive the common voltage from the fourth sub common voltage supplying part 210d.

Referring to FIG. 3, in a display device 1 according to the first exemplary embodiment of the present invention, the circuit substrate 303 is attached to a single side of the insulating substrate 110. That is, the display device 1 requires no additional circuit substrate for driving the gate driving part 302 or supplying the common voltage. Therefore, the requirement of additional components is reduced according to the configuration of the first exemplary embodiment of a display device 1 according to the present invention.

The first sub common voltage supplying part 210a and the second sub common voltage supplying part 210b transmit the common voltage to the common electrode 190 without occupying a separate area. The common voltage supplying part 210 is connected with the common electrode 190 through all four sides of the insulating substrate 110, thereby efficiently supplying the common voltage.

Therefore, connection issues related to alignment errors in manufacturing processes are reduced, since the common voltage supplying part 210 is connected to all four sides of the insulating substrate 110 to transmit the common voltage to the display area. The common electrode 190 may be contacted with at least one face of the common voltage supplying part 210 part.

Hereinafter, the display area will now be described in more detail with reference to FIGS. 2 and 9.

The gate line 121 and a gate electrode 122 are formed over the insulating substrate 110 formed of an insulating material. Exemplary embodiments of the insulating material include materials such as glass, quartz, ceramic, plastic, or other similar materials. As in the illustrated exemplary embodiment, the gate line 121 is connected to the gate pad 124 (FIG. 7).

The gate insulating layer 131 formed of silicon nitride ("SiNx") or the like is formed over the gate line 121 and the gate electrode 122, as well as on exposed portions of the insulating substrate 110.

A semiconductor layer 132 formed of amorphous silicon ("a-Si") and an ohmic contact layer 133 formed of hydrogenated n+a-Si doped with an n-type impurity of high density are formed in order over the gate insulating layer 131 under which the gate electrode 122 is positioned. As in the illustrated exemplary embodiment, the ohmic contact layer 133 is separated about the gate electrode 122, as illustrated in FIG. 9, to expose a portion of the semiconductor layer 132.

A source electrode 142 and a drain electrode 143 are formed on the ohmic contact layer 133 and the gate insulating layer 131. The source electrode 142 and the drain electrode 143 are separated about the gate electrode 122, with the gate electrode 122 disposed there between. The source electrode 142 may extend from the power supply line 145.

The passivation layer 151 is formed on the source electrode 142, the drain electrode 143, and the portion of the semiconductor layer 132 not covered by the source electrode 142 and the drain electrode 143, as well as on exposed portions of the gate insulating layer 131. The passivation layer 151 may be formed of silicon nitride ("SiNx").

A planarizing layer 152 is formed over the passivation layer 151. The planarizing layer 152 may be formed of one of benzocyclobutene series ("BCB"), olefin series, acrylic resin series, polyimide series, and fluoroplastic series. The fluoroplastic series includes polytetrafluoroethylene ("PTFE"), perfluorocyclobutane ("PFCB"), fluorinatedethylenepropylene ("FEP"), polyfluoroalkoxy ("PFA"), ethylenepolytetrafluoroethylene ("ETFE") and polyvinylidenefluoride ("PVDF"). The fluoroplastic series further includes 'Cytop' manufactured by Asahi Glass in Japan, the structural formula of which is as follows:

Structural Formula 1

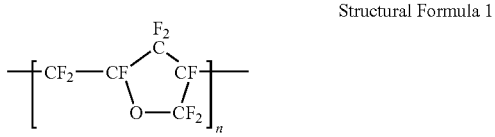

Figure 9:
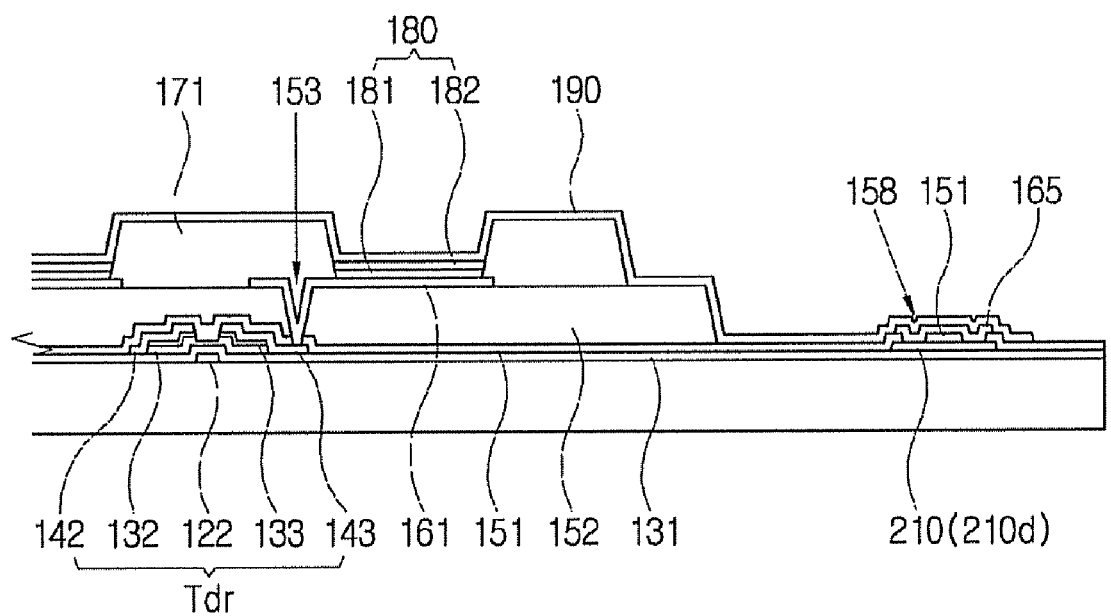
FIG. 9 is an enlarged schematic cross-sectional view taken along line IX-IX in FIG. 2.

Referring to FIG. 9, a pixel electrode 161 is formed on the planarizing layer 152. The pixel electrode 161 supplies a hole to an organic layer 180. The pixel electrode 161 may be formed of a transparent conductive material such as indium tin oxide ("ITO"), indium zinc oxide ("IZO"), or other similar materials, and is connected with the drain electrode 143 through the contact hole 153.

The contact members 162, 163 and 165 of the non-display area and the bridge part 164 are on the same layers of the display device 1 as the pixel electrode 161.

A wall 171 surrounding the pixel electrode 161 is formed on the pixel electrode 161 and the planarizing layer 152. The wall 171 divides the pixel electrodes 161 to define a pixel area. The wall 171 prevents the source electrode 142 and the drain electrode 143 of the TFT Tdr from being short-circuited with the common electrode 190. The wall 171 may be formed of a photoresist material with thermal resistance and solvent resistance such as acrylic resin, polyimide, or other similar materials. Also, an alternative exemplary embodiment of the wall 171 may include a two level configuration including an organic layer and an inorganic layer.

Still referring to FIG. 9, the organic layer 180 is formed on the pixel electrode 161 within the pixel area defined by the wall 171, and includes a hole injecting layer 181 and a light emitting layer 182.

The hole injection layer 181 may be formed of a mixture of polythiophen derivatives such as poly (3,4-ethylenedioxythiophene) ("PEDOT"), or other similar materials and polystyrene sulphonate ("PSS"), or other similar materials.

The light emitting layer 182 within each pixel area includes one of a red light emitting layer, a green light emitting layer, and a blue light emitting layer, and the matrix of pixel areas includes the light emitting layers 182 of different colors repeatedly formed.

The light emitting layer 182 may be formed of polyfluorene derivatives, (poly) paraphenylenevinylene derivatives, polyphenylene derivatives, polyvinyl carbazole, polythiophen derivatives, or these high molecular substances doped with a perylene series pigment, a rhodermine series pigment, rubrene, perylene, 9,10-diphenylanthracene, tetraphenylbutadiene, nile red, coumarin 6, quinacridone, or other similar materials.

A hole transmitted from the pixel electrode 161 and an electron transmitted from the common electrode 190 are coupled to form an exciton in the light emitting layer 182. When the exciton de-excites, e.g., when the electron falls from a higher energy state to a lower energy state, a photon is emitted.

As illustrated in FIG. 9, the common electrode 190 is positioned over the wall 171 and the light emitting layer 182.

The common electrode 190 supplies an electron to the light emitting layer 182. The common electrode 190 may include a lithium fluoride layer and an aluminum fluoride layer. In a bottom emission type display, the common electrode 190 is formed of an opaque material such as aluminum, silver, or other similar substance, and the light generated from the light emitting layer 182 is emitted toward the insulating substrate 110.

The display device 1 includes an encapsulation substrate (not shown) since the organic layer 180 is easily affected by moisture and oxygen. The encapsulation substrate may be formed of glass or stainless steel, and may be coupled to the insulating substrate 110 by using a sealant (not shown).

Hereinafter, a display device according to a second exemplary embodiment of the present invention will now be described in more detail with reference to FIG. 10.

Figure 10:
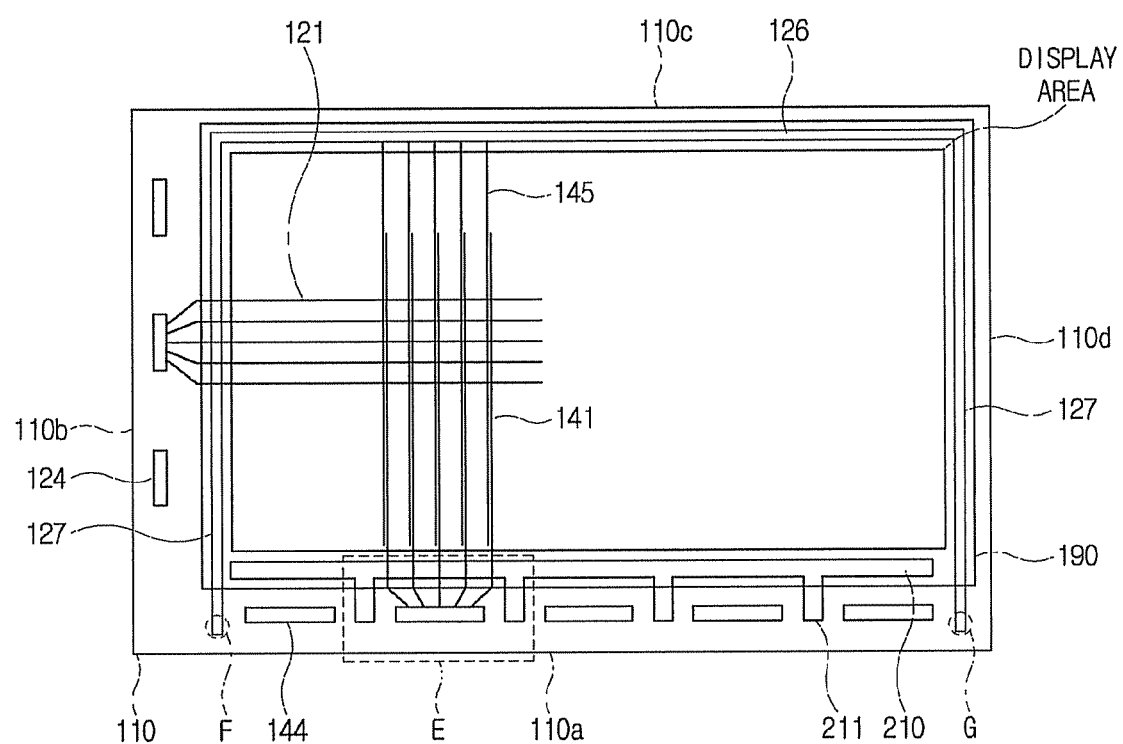
FIG. 10 is schematic top plan layout view of a second exemplary embodiment of a display device according to the present invention.

As shown in FIG. 10, a common voltage supplying part 210 is only formed below a display area, and not on other areas. On the other hand, a driving voltage supplying part 126 is formed above the display area. A power supply line 145 is connected to the driving voltage supplying part 126, and does not overlap the common voltage supplying part 210.

Figure 11:
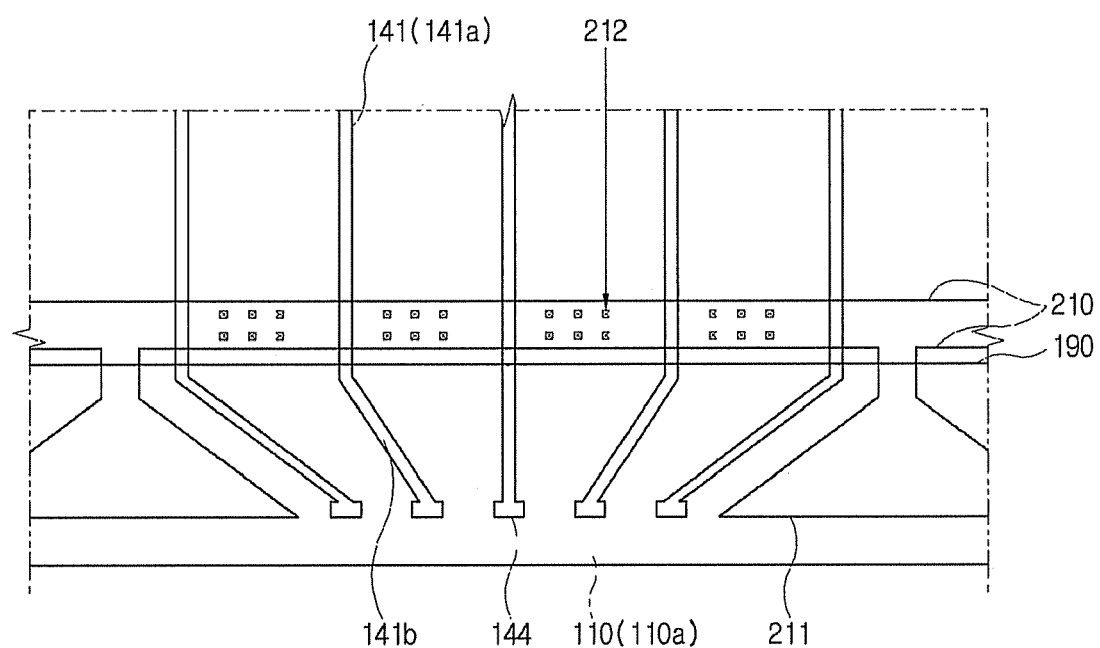
FIG. 11 is an enlarged schematic top plan layout view illustrating portion 'E' in FIG. 10.

Hereinafter, the common voltage supplying part 210 according to the second exemplary embodiment will now be described in more detail with reference to FIG. 11.

As shown therein, the common voltage supplying part 210 is formed in a layer different from a layer corresponding to a data line 141. The common voltage supplying part 210 extends substantially perpendicular to the data line 141 of a main body part 141a. A common electrode 190 receives a common voltage through a contact hole 212 formed over the common voltage supplying part 210.

Referring to FIG. 10, a common voltage pad 211 is positioned in between a data driving part 301 (as previously shown in FIG. 3), and receives the common voltage from a circuit substrate 303 (FIG. 3). The common voltage pad 211 and the common voltage supplying part 210 are integrally formed.

Referring to FIG. 10 again, the driving voltage supplying part 126 is electrically connected with the circuit substrate 303 through a driving voltage transmitting part 127. The driving voltage supplying part 126 is formed in the same layer as the data line 141. The driving voltage supplying part 126 is formed integrally with the driving voltage transmitting part 127 and the power supply line 145.

End parts F and G of the driving voltage supplying part 126 receive a driving voltage from the circuit substrate 303.

Hereinafter, an exemplary display device according to a third exemplary embodiment of the present invention will now be described in more detail with reference to FIG. 12.

Figure 12:
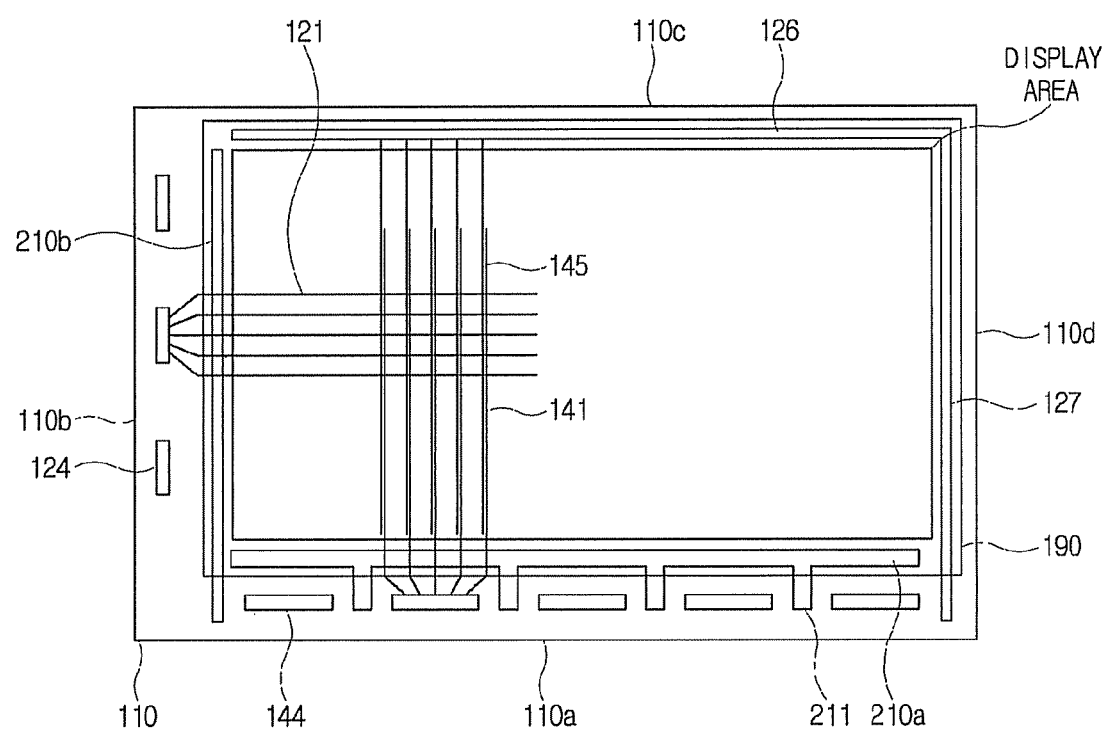
FIG. 12 is a schematic top plan layout view of a third exemplary embodiment of a display device according to the present invention.

As shown in FIG. 12, a common voltage supplying part 210 is formed below and to the left side of a display area. A common voltage supplying part 210 includes a first sub common voltage supplying part 210a positioned below the display area, and a second sub common voltage supplying part 210b positioned on the left side of the display area. The first sub common voltage supplying part 210a and the second sub common voltage supplying part 210b are formed in different layers.

A driving voltage supplying part 126 is formed above the display area. The driving voltage supplying part 126 receives a driving voltage through a driving voltage transmitting part 127 positioned on the right side of the display area.

As described above, the present invention provides a display device supplying a common voltage with a relatively small sized insulating substrate.

Also, in view of the above-described display device, the present invention also provides a manufacturing method of a display device supplying a common voltage with a relatively small sized insulating substrate. For example, a manufacturing method of the display device may include forming a line part including a main body part having lines substantially paralleling each other, and a fan out part extending from the main body part, forming a common voltage supplying part crossing the main body part and insulated from the main body part, forming an insulating layer on the common voltage supplying part and having a contact hole exposing the common voltage supplying part under the insulating layer, and forming a common electrode electrically connected with the common voltage supplying part exposed through the contact hole.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
an insulating substrate comprising a display area;
a line part comprising a data line and a gate line, the data line crossing the gate line, the data line and the gate line insulated from each other;
a common voltage supplying part formed outside an outer circumference of the display area;
an insulating layer formed on the common voltage supplying part, and comprising a contact hole formed on an area in which some lines of the line part extend substantially in parallel with each other; and
a common electrode electrically connected with the common voltage supplying part exposed through the contact hole.

2. The display device according to claim 1, further comprising a circuit substrate connected to a first side of the insulating substrate substantially in parallel with an extending direction of the gate line, the circuit substrate providing a common voltage to the common voltage supplying part,
wherein the common voltage supplying part comprises a first sub common voltage supplying part positioned between the display area and the circuit substrate, and the common voltage supplying part extending substantially in parallel with the gate line.

3. The display device according to claim 2, wherein the first sub common voltage supplying part and the data line are formed in different layers of the display device.

4. The display device according to claim 3, wherein the data line comprises a main body part including a plurality of parallel lines, and a fan out part including a plurality of lines extending from the main body part toward the circuit substrate, and
the first sub common voltage supplying part extends substantially perpendicular to and crosses the main body part of the data line.

5. The display device according to claim 3, further comprising a contact member contacting the common voltage supplying part exposed through the contact hole, and the contact member formed of a transparent conductive material.

6. The display device according to claim 2, wherein the data line comprises a main body part including a plurality of parallel lines, and a fan out part including a plurality of lines extending from the main body part toward the circuit substrate, and
the first sub common voltage supplying part extends substantially perpendicular to and crosses the main body part of the data line.

7. The display device according to claim 2, further comprising a gate driving part positioned on a second side of the insulating substrate substantially in parallel with an extending direction of the data line, and the gate driving part connected with the gate line,
wherein the common voltage supplying part comprises a second sub common voltage supplying part positioned in between the gate driving part and the display area, and extending substantially in parallel with the data line.

8. The display device according to claim 7, wherein the second sub common voltage supplying part and the gate line are formed in different layers of the display device.

9. The display device according to claim 8, wherein the gate line comprises a main body part including a plurality of parallel lines, and a fan out part including lines extending from the main body part toward the gate driving part, and
the second sub common voltage supplying part extends substantially perpendicular to and crosses the main body part of the gate line.

10. The display device according to claim 7, wherein the gate line comprises a main body part including a plurality of parallel lines, and a fan out part including lines extending from the main body part toward the gate driving part, and
the second sub common voltage supplying part extends substantially perpendicular to and crosses the main body part of the gate line.

11. The display device according to claim 2, further comprising a power supply line substantially parallel with the data line, and
a driving voltage supplying part positioned between the display area and the circuit substrate, and the driving voltage supplying part extending substantially in parallel with the gate line to supply a driving voltage to the power supply line.

12. The display device according to claim 11, wherein the insulating substrate includes a rectangular shape, and
the common voltage supplying part is disposed on four sides of the insulating substrate.

13. The display device according to claim 2, further comprising a power supply line substantially in parallel with the data line,
a driving voltage supplying part elongated adjacent to a third side of the insulating substrate facing the first side, and connected with the power supply line, and
a driving voltage transmitting part connecting the driving voltage supplying part and the circuit substrate.

14. The display device according to claim 13, wherein a pair of driving voltage transmitting parts face each other to interpose the display area there between.

15. The display device according to claim 2, further comprising a contact member contacting the common voltage supplying part exposed through the contact hole, and the contact member formed of a transparent conductive material.

16. The display device according to claim 1, further comprising a contact member contacting the common voltage supplying part exposed through the contact hole, and the contact member formed of a transparent conductive material.

17. A display device, comprising:
a line part comprising a main body part having lines substantially paralleling each other, and a fan out part having lines extending from the main body part;
a common voltage supplying part, the common voltage supplying part crossing the main body part and insulated from the main body part;

an insulating layer formed on the common voltage supplying part, and comprising a contact hole exposing the common voltage supplying part; and a common electrode electrically connected with the common voltage supplying part exposed through the contact hole.

18. The display device according to claim 17, wherein the main body part and the common voltage supplying part extend substantially perpendicular to and cross each other.

19. The display device according to claim 17, wherein the main body part and the common voltage supplying part are formed in different layers of the display device.

20. The display device according to claim 17, wherein the line part comprises at least one of a gate line, a data line, and a power supply line.

21. The display device according to claim 17, wherein the contact hole is provided in plurality between adjacent lines of the main body part.

22. A manufacturing method of a display device, the method comprising:

forming a line part comprising a main body part having lines substantially paralleling each other, and a fan out part extending from the main body part;

forming a common voltage supplying part crossing the main body part and insulated from the main body part;

forming an insulating layer on the common voltage supplying part and comprising a contact hole exposing the common voltage supplying part under the insulating layer; and forming a common electrode electrically connected with the common voltage supplying part exposed through the contact hole.

* * * * *